United States Patent
Niki et al.

(10) Patent No.: US 9,054,633 B2
(45) Date of Patent: Jun. 9, 2015

(54) BIAS CURRENT CIRCUIT AND SEMICONDUCTOR INTEGRATED CIRCUIT

(71) Applicant: KABUSHIKI KAISHA TOSHIBA, Tokyo (JP)

(72) Inventors: Yusuke Niki, Tokyo (JP); Daisuke Miyashita, Kanagawa (JP)

(73) Assignee: Kabushiki Kaisha Toshiba, Tokyo (JP)

(*) Notice: Subject to any disclaimer, the term of this patent is extended or adjusted under 35 U.S.C. 154(b) by 0 days.

(21) Appl. No.: 14/016,178

(22) Filed: Sep. 2, 2013

(65) Prior Publication Data

US 2014/0203880 A1 Jul. 24, 2014

(30) Foreign Application Priority Data

Jan. 22, 2013 (JP) .................................. 2013-009229

(51) Int. Cl.
*H03L 1/00* (2006.01)
*H03B 5/04* (2006.01)
*H03L 7/099* (2006.01)

(52) U.S. Cl.
CPC . *H03B 5/04* (2013.01); *H03L 7/099* (2013.01)

(58) Field of Classification Search
USPC ....................... 331/108 R, 109, 182, 183, 186
See application file for complete search history.

(56) References Cited

U.S. PATENT DOCUMENTS

2009/0273331 A1* 11/2009 Inoue ............................ 323/312

FOREIGN PATENT DOCUMENTS

| JP | 2001-326574 A | 11/2001 |
| JP | 2004-007588 A | 1/2004 |
| JP | 2006-245860 A | 9/2006 |
| JP | 2008-283333 A | 11/2008 |

OTHER PUBLICATIONS

A. Elshazly et al.,"A 0.4-to-3GHz Digital PLL with Supply-Noise Cancellation Using Deterministic Background Calibration" 2011 IEEE International Solid-State Circuits Conference, Digest of Technical Papers, pp. 92-94, 2011.

* cited by examiner

*Primary Examiner* — Joseph Chang
(74) *Attorney, Agent, or Firm* — Patterson & Sheridan, LLP

(57) ABSTRACT

A bias current circuit controls an oscillator that generates an oscillation signal of a frequency corresponding to an input current. The circuit includes a part that detects fluctuation of a control current for variably controlling the frequency of the oscillation signal and a part that generates an input current in which a fluctuation component of the control current is canceled using a current for cancelling the detected fluctuation of the control current.

19 Claims, 5 Drawing Sheets

BIAS CURRENT CIRCUIT AND SEMICONDUCTOR INTEGRATED CIRCUIT

FIELD

Embodiments of the present invention relate to a bias current circuit and a semiconductor integrated circuit.

BACKGROUND

A phase-locked loop circuit (PLL) is used to generate a reference clock signal in various electronic circuits. A PLL has an oscillator that generates an oscillation signal of a frequency corresponding to an external signal. As one of various known oscillators, there is a current-controlled oscillator in which a frequency of an oscillation signal is controlled by an input control current. The control current is generated by, for example, a current source capable of controlling an amount of a current, and a current mirror copying a current flowing through the current source.

However, there is a problem that when the power-supply voltage of the oscillator fluctuates, the control current also fluctuates. As a result, it is difficult to generate a precise oscillation signal.

SUMMARY

Embodiments provide a bias current circuit that controls an oscillator to generate a precise oscillation signal therein, and a semiconductor integrated circuit that includes the bias current circuit and the oscillator.

According to the embodiments, a bias current circuit is provided that controls an oscillator that generates an oscillation signal of a frequency corresponding to an input current. The bias current circuit includes a portion that detects fluctuation of a current for variably controlling the frequency of the oscillation signal, and a cancelling portion that generates an input current in which a fluctuation component of the control current has been canceled using a current for cancelling out the detected fluctuation of the control current.

DETAILED DESCRIPTION

In the following, embodiments are explained in detail with reference to the drawings.

First Embodiment

Figure 1:
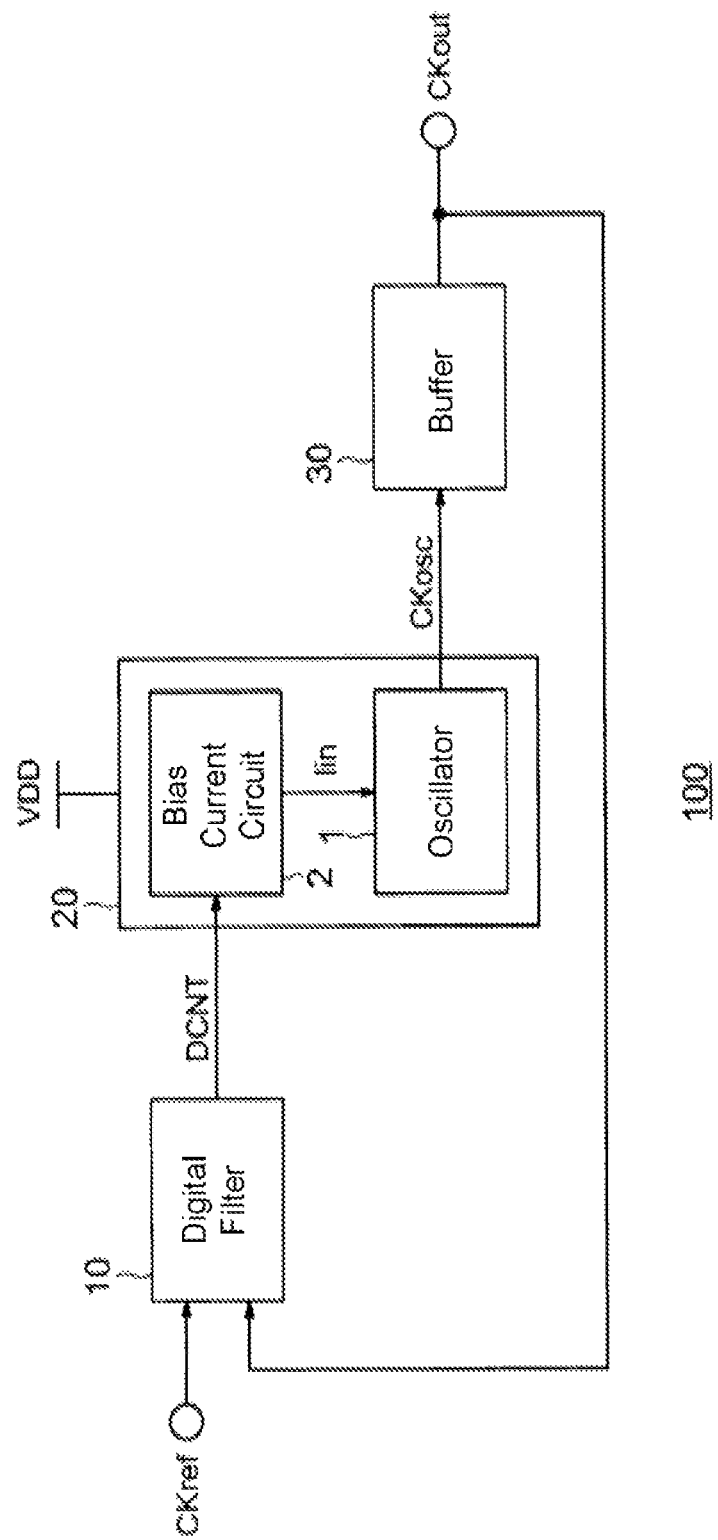
FIG. 1 is a block diagram illustrating a configuration of an all-digital phase-locked loop (ADPLL) 100.

FIG. 1 is a block diagram illustrating a configuration of an all-digital phase-locked loop circuit, hereinafter an ADPLL 100. The ADPLL 100 is provided with a digital filter 10, a semiconductor integrated circuit 20, and a buffer 30.

The digital filter 10 generates a control signal DCNT corresponding to a phase difference between a reference signal CKref whose frequency is constant with high precision, and an output signal CKout. The control signal DCNT is a digital signal, and it is changed to reduce the phase difference between the reference signal CKref and the output signal CKout.

The semiconductor integrated circuit 20 includes an oscillator 1 and a bias current circuit 2. The bias current circuit 2 generates a current corresponding to the control signal DCNT and inputs the current as an input current Iin to the oscillator 1. The oscillator 1 is a current-controlled oscillator and it generates an oscillation signal CKosc having a frequency which is determined according to the input current Iin. That is, the semiconductor integrated circuit 20 including an oscillator generates an oscillation signal CKosc at a frequency corresponding to the control signal DCNT.

The buffer 30 amplifies the oscillation signal CKosc and outputs the amplified output signal as CKout. The output signal CKout is again input as a feedback signal to the digital filter 10.

By a feedback control as described above, the ADPLL 100 is capable of generating an output signal CKout of a constant frequency.

However, a power-supply voltage VDD supplied to the ADPLL 100 may fluctuate due to some reasons. When the power-supply voltage VDD fluctuates, the input current Iin may also fluctuate, and the resulting frequency of the oscillation signal CKosc will also fluctuate. As a result, jitter in the output signal CKout may increase.

Therefore, in the present embodiment, a bias current circuit 2 in the semiconductor integrated circuit 20 is provided, such that the input current Iin does not fluctuate even when the power-supply voltage VDD fluctuates.

Figure 2:
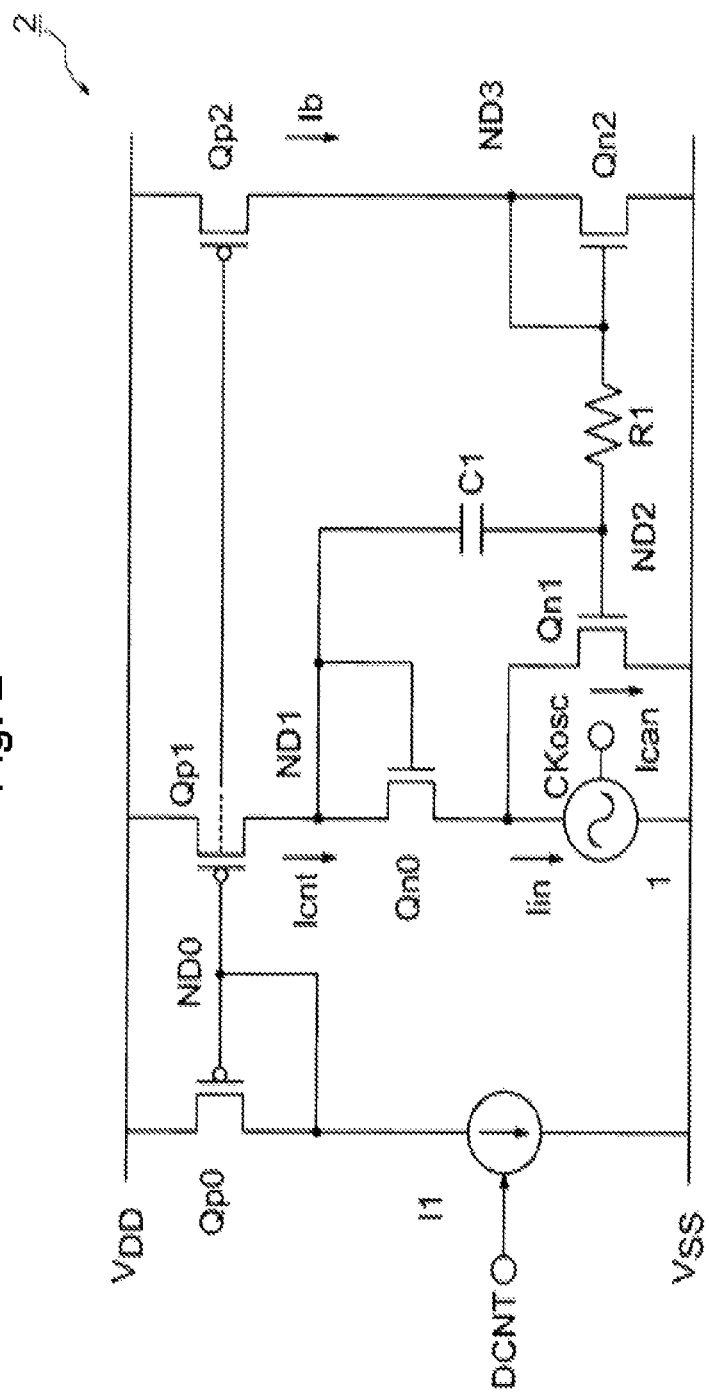
FIG. 2 is a circuit diagram of a semiconductor integrated circuit 20 according to a first embodiment.

FIG. 2 is a circuit diagram of the semiconductor integrated circuit 20 according to the first embodiment. In the circuit illustrated in FIG. 2, the bias current circuit 2 is the portion that omits the oscillator 1 from the semiconductor integrated circuit 20.

The bias current circuit 2 is provided with pMOS transistors Qp0-Qp2, nMOS transistors Qn0-Qn2, a capacitor C1, a resistor R1, and a current source I1.

The transistor Qp0 and the current source I1 are connected in series between a power-supply terminal (referred to as the power-supply terminal, hereinafter "VDD") that supplies a power-supply voltage (second reference voltage) VDD and a ground terminal (referred to as the ground terminal "VSS" hereafter) that supplies a ground voltage (first reference voltage) VSS.

The transistors Qp1, Qn0, and the oscillator 1 are also connected in series between the power-supply terminal VDD and the ground terminal VSS. When the oscillator 1 includes two transistors that are connected in series, a total of four transistors are connected in series between the power-supply terminal VDD and the ground terminal VSS.

The transistor Qp0 is diode-connected. The drain and the gate of the transistor Qp0 are short-circuited at node ND0 and are therefrom connected to the gate of the transistor Qp1. The transistor Qn0 is also diode-connected. The drain and the gate of the transistor Qn0 are also short-circuited, here at node ND1.

The transistor Qn1 is connected in parallel with the oscillator 1. A capacitor C1 is connected between the node ND1 and a node ND2 that is electrically connected to the gate of the transistor Qn1. The transistors Qp2 and Qn2 are connected in series between the power-supply terminal VDD and the ground terminal VSS. The gate of the transistor Qp2 is connected to the gates of the transistors Qp0 and Qp1. The transistor Qn2 is diode-connected. The drain and the gate of the transistor Qn2 are short-circuited at node ND3. The resistor R1 is connected between the node ND2 and the node ND3. It is designed such that transconductance of the transistor Qn0 and Qn1 is equal to each other.

The current flowing through the current source I1 is controlled according to the control signal DCNT. Furthermore, a current mirror is composed of the transistors Qp0 and Qp1. Therefore, a current proportional to the current flowing through the current source I1, that is, the current flowing between the source and the drain of the transistor Qp0, flows between the source and the drain of the transistor Qp1. The current flowing through the transistor Qp1 is referred to as the control current Icnt in the following. The frequency of the oscillation signal CKosc is variably controlled by the control current Icnt.

Due to fluctuation of the power-supply voltage VDD, the control current Icnt may also fluctuate. Therefore, if the control current Icnt, as it may fluctuate, is input to the oscillator 1, there is a risk that the frequency of the output oscillation signal CKosc may also fluctuate.

Therefore, the transistors Qn0-Qn2, Qp2, the capacitor C1, and the resistor R1 are provided to suppress such fluctuation of the frequency.

The transistor Qn0 is an example of a conversion part. A set of the capacitor C1 and the resistor R1 is an example of a filter part. The transistor Qn1 and a connection node of the transistors Qn0 and Qn1 are an example of a cancel part. Furthermore, a set of the transistor Qn0, the capacitor C1, and the resistor R1 is an example of a detection part.

The transistors Qp2 and Qn2 generate a bias current Ib for operating the transistor Qn1. The gate of the transistor Qp2 is connected to the gate of the transistor Qp1. Therefore, the bias current Ib is proportional to the control current Icnt. Due to the bias current Ib, a voltage of the node ND3 is input to the gate of the transistor Qn1 via the resistor R1. When the control current Icnt does not fluctuate, the gate voltage of the transistor Qn1 is determined according to the bias current Ib, and this voltage becomes an operation reference voltage of the transistor Qn1.

The transistor Qn0 converts the control current Icnt to a voltage. That is, when the control current Icnt fluctuates, the voltage at the node ND1 fluctuates.

Due to the capacitor C1 and the resistor R1, a high-pass filter (HPF) and a low-pass filter (LPF) are composed. When the voltage of the node ND1 fluctuates and has a high-frequency component, the high-frequency component (that is, a voltage fluctuation component) is extracted and is transmitted to the node ND2 via the capacitor C1. As a result, according to the voltage fluctuation of the node ND1, in other words, according to the fluctuation of the control current Icnt, the above-described gate voltage of the transistor Qn1 fluctuates. The cut-off frequencies of the HPF and the LPF may be designed by considering an anticipated fluctuation of the power-supply voltage VDD.

As described above, in the present embodiment, the fluctuation of the control current Icnt is detected as a voltage fluctuation of the node ND1 and this fluctuation is transmitted to the transistor Qn1 via the capacitor C1. Since the number of devices involved in the transmission is small, the fluctuation of the control current Icnt can be transmitted to the transistor Qn1 with high precision.

A current Ican corresponding to a gate voltage (voltage of the node ND2) flows between the source and the drain of the transistor Qn1. As can be seen from the above explanation, the current Ican fluctuates according to the voltage of the node ND1, in other words, according to the fluctuation of the control current Icnt.

A portion of the control current Icnt is input as the input current Iin at the input terminal of the oscillator 1, and a portion of the control current Icnt also flows as the cancelling current Ican between the source and the drain of the transistor Qn1. Therefore, a current, obtained by subtracting the current Ican from the control current Icnt, is generated by the connection node of the transistors Qn0, Qn1, and is input as the input current Iin (=Icnt−Ican) to the oscillator 1.

Figure 3:
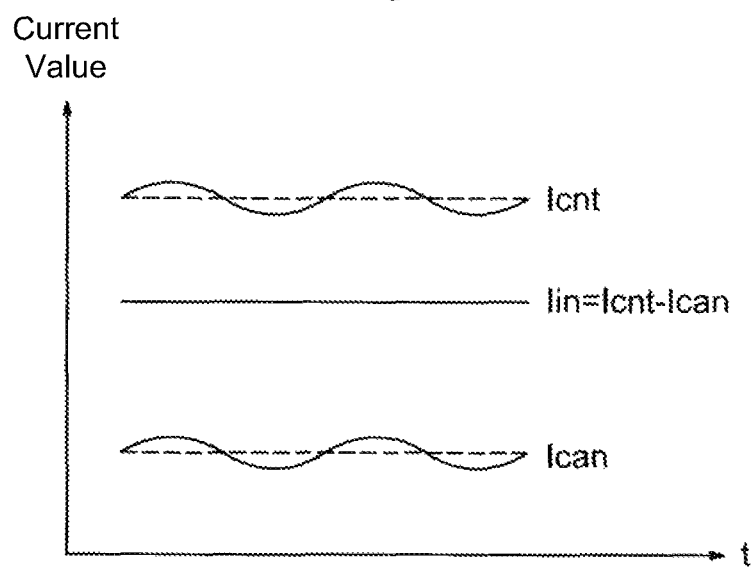
FIG. 3 is a diagram for explaining an operation of a bias current circuit 2.

FIG. 3 is a diagram for explaining an operation of the bias current circuit 2. A vertical axis represents current values of the currents Icnt, Iin, Ican, and a horizontal axis represents time t. When the power-supply voltage VDD fluctuates, the control current Icnt also fluctuates. Then, the current Ican is generated that fluctuates along with the fluctuation of the control current Icnt. Here, the transconductance of the transistors Qn0 and Qn1 is equal to each other. Therefore, the fluctuation amplitude of the current Icnt is equal to that of the current Ican.

The current Ican fluctuates in the same way, i.e., with the same frequency and cancelling amplitude as the control current Icnt. Therefore, fluctuating portions of the currents are canceled and a constant input current Iin is input to the oscillator. As a result, the input current Iin (=Icnt−Ican) is constant even when the current Icnt fluctuates.

In order to reduce power consumption of the bias current circuit 2, a size of the transistor Qp2 may be made smaller than that of the transistor Qp1. For example, by making the size of the transistor Qp2 to be 1/n (n is a number larger than 1) of the size of the transistor Qp1, the bias current Ib can be 1/n of the control current Icnt. In this case, the size of the transistor Qn1 may be n times of a size of the transistor Qn0. This allows the transconductance of the transistor Qn0 and Qn1 to be equal to each other.

A size of a transistor may be adjusted by both a gate length L and a gate width W. However, when the gate length L is constant in a manufacturing process, the size of the transistor can be adjusted by the gate width W.

As described above, in the first embodiment, the fluctuation of the control current Icnt is detected and the current Ican for cancelling the fluctuation of the control current Icnt is generated. Then, the input current Iin, obtained by subtracting the current Ican from the control current Icnt, is input to the oscillator 1. As a result, even when the control current Icnt fluctuates, the oscillator 1 can generate the oscillation signal CKosc at a precise frequency.

Figure 4:
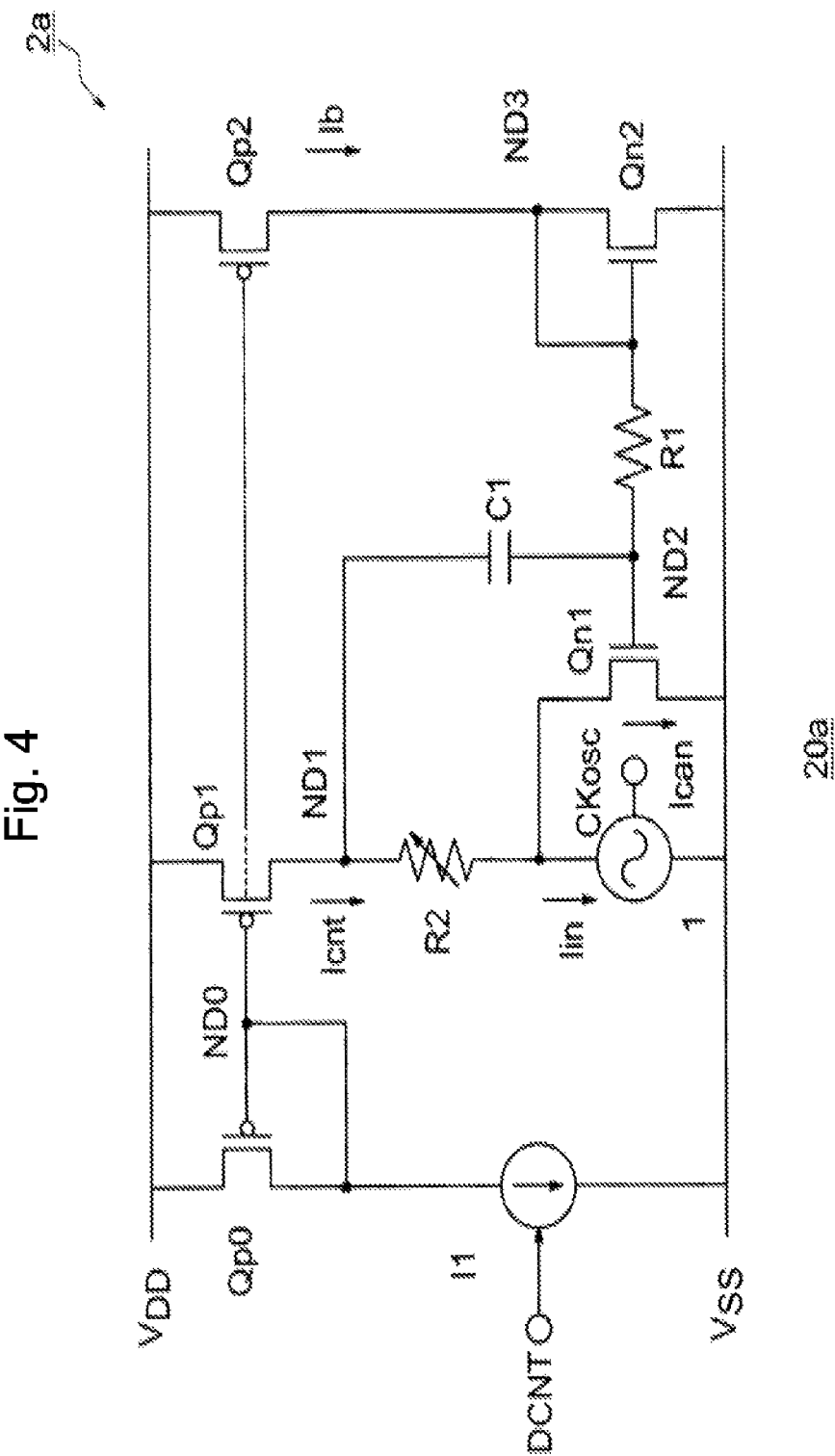
FIG. 4 is a circuit diagram of a semiconductor integrated circuit 20a that is a modification example of the embodiment shown in FIG. 2.

FIG. 4 is a circuit diagram of a semiconductor integrated circuit 20a that is a modification example of the embodiment shown in FIG. 2. In a bias current circuit 2a of FIG. 4, a variable resistor R2 is used in place of the transistor Qn0 of FIG. 2. A resistance value of the variable resistor R2 is designed to be an inverse of the transconductance of the transistor Qn1. This allows the bias current circuit 2a of FIG. 4 to operate in the same manner as the bias current circuit 2 of FIG. 2. When the control current Icnt flowing through the variable resistor R2 is small, a voltage drop due to the variable resistor R2 is small. Therefore, the power-supply voltage VDD can be lowered.

Second Embodiment

In the above-described first embodiment, the transistor Qn0 is provided between the transistor Qp1 and the oscillator 1 to detect the fluctuation of the control current Icnt. In contrast, in a second embodiment described below, the fluctuation of the control current Icnt is detected without providing a device between the transistor Qp1 and the oscillator 1.

Figure 5:
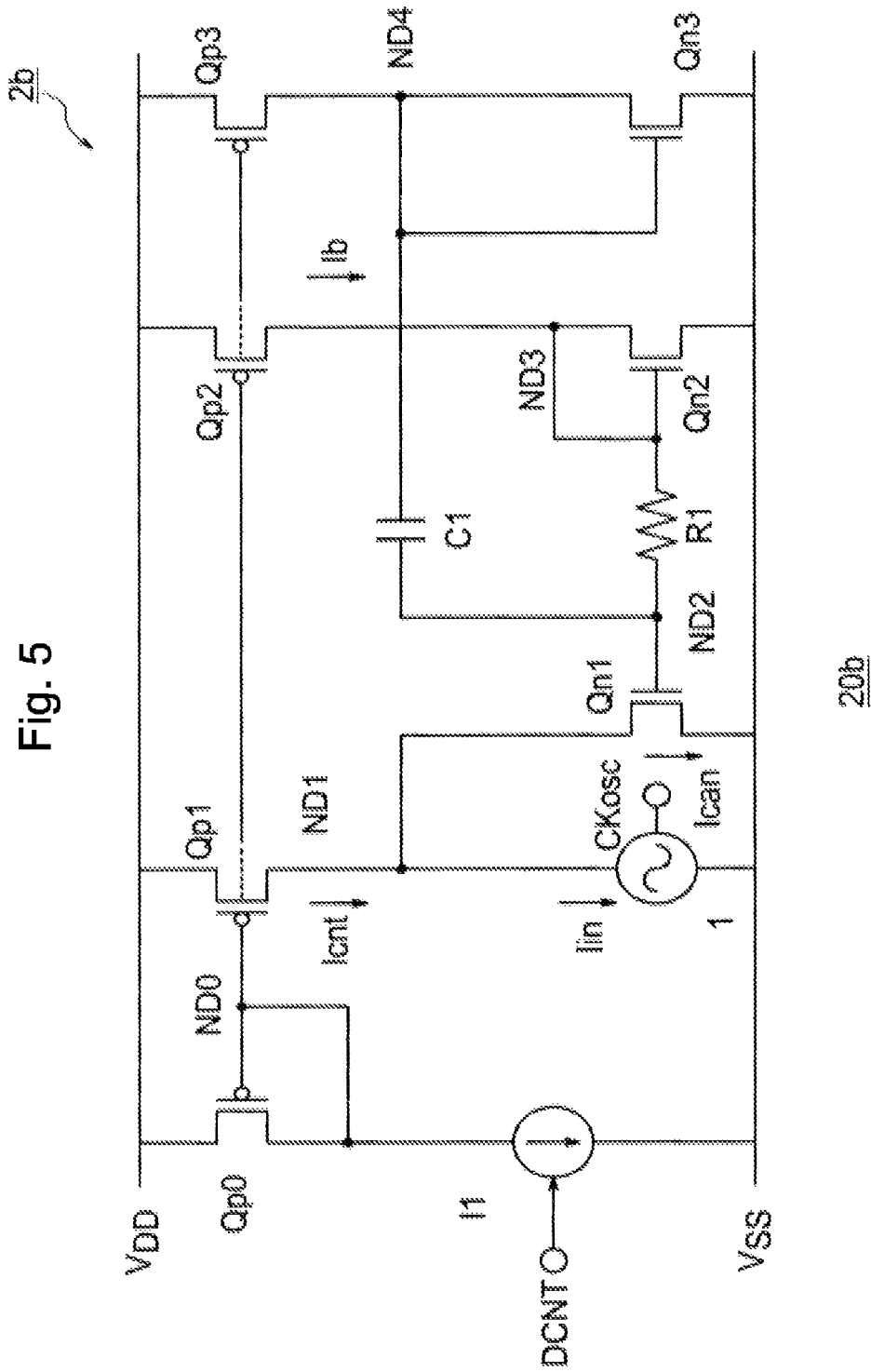
FIG. 5 is a circuit diagram of a semiconductor integrated circuit 20b according to a second embodiment.

FIG. 5 is a circuit diagram of a semiconductor integrated circuit 20b according to the second embodiment. The following explains mainly the differences in the circuit as compared to the circuit of FIG. 2.

In contrast to the circuit of FIG. 2, in the bias current circuit 2b of FIG. 5, the drain of the transistor Qp1 is directly connected to the oscillator 1. For example, when the oscillator 1 includes two transistors that are connected in series, a total of three transistors are connected in series between the power-supply terminal VDD and the ground terminal VSS. Therefore, as compared to FIG. 2, in the circuit of FIG. 5, the number of devices connected between the power-supply terminal VDD and the ground terminal VSS are smaller.

Furthermore, the bias current circuit 2b is further provided with a pMOS transistor Qp3 and an nMOS transistor Qn3 that are connected in series between the power-supply terminal VDD and the ground terminal VSS. The gate of the transistor Qp3 is connected to the node ND0 that is electrically connected to the gate of the transistors Qp0-Qp2. The transistor Qn3 is diode-connected. The drain and the gate of the transistor Qn3 are short-circuited at node ND4. A capacitor C1 is connected between the node ND4 and the node ND2. It is designed such that transconductance of the transistors Qn3 and Qn1 are equal to each other.

The transistors Qp3 and Qn3 are an example of the conversion part.

Since the gate of the transistor Qp1 and the gate of the transistor Qp3 are connected, a current proportional to the control current Icnt flows between the source and the drain of the transistor Qp3. Therefore, when the control current Icnt fluctuates, the current flowing between the source and the drain of the transistor Qp3 also fluctuates in proportion to the fluctuation of the control current Icnt. As a result, a current flowing between a source and a drain of the transistor Qn3 also fluctuates and a voltage of the node ND4 also fluctuates.

Thus, the voltage of the node ND4 also fluctuates based upon the fluctuation of Icnt. The voltage fluctuation of the node ND4 is transmitted to the node ND2 by the HPF and LPF that are composed of the resistor R1 and the capacitor C1.

Other operations are substantially the same as those of FIG. 2. As a result, the input current Iin, obtained by subtracting from the control current Icnt, the cancel current Ican that corresponds to a fluctuation component of the control current Icnt, is input to the oscillator 1.

In order to detect the fluctuation of the control current Icnt with high precision, it is desirable that a size of the transistor Qp3 be about the same as the size of the transistor Qp1, without changing the size of the transistor Qp3.

As described above, in the second embodiment, the fluctuation of the control current Icnt is detected and the current Ican for cancelling the fluctuation of the control current Icnt is generated. Therefore, even when the control current Icnt fluctuates, the oscillator 1 can generate the oscillation signal CKosc of a precise frequency.

Furthermore, in the first embodiment, the transistors Qp1, Qn0, and the oscillator 1 are connected in series between the power-supply terminal VDD and the ground terminal VSS, whereas in the second embodiment, the transistor Qp1 and the oscillator 1 are directly connected in series between the power-supply terminal VDD and the ground terminal VSS. Fewer devices are connected between the power-supply terminal VDD and the ground terminal VSS in the second embodiment. Therefore, the second embodiment can be operated even at a lower power-supply voltage than the first embodiment.

In the first and the second embodiments, an example in which the bias current circuit 2 controls the oscillator 1 is described. However, the bias current circuit 2 can be generally used for controlling a circuit with a current input.

The bias current circuit of FIG. 2 and the like is merely an example and various modifications are possible. For example, at least some of the MOS transistors may be configured by using other semiconductor devices such as bipolar transistors. Furthermore, it is also possible to configure the bias current circuit in such a manner that conductivity types of the transistors are reversed and, accordingly, the connection positions of the power-supply terminal and the ground terminal are reversed. In this case, the basic operation principle is also the same.

The entire circuit of the oscillator and the bias current circuit according to the present invention may be formed on a same semiconductor substrate; and a part of the circuit may also be formed on a separate semiconductor substrate. Further, at least a part of the oscillator and the bias current circuit according to the present invention may be mounted on a printed circuit board and the like by using a discrete component.

Several embodiments of the present invention are explained in the above. However, these embodiments are presented by way of example and are not intended to limit the scope of the invention. These embodiments can be embodied in various forms and various omissions, substitutions and modifications can be performed within the scope without departing from the spirit of the invention. These embodiments and modifications thereof, same as being within the scope and spirit of the invention, are within the scope of the invention as described in the appended claims and its equivalents.

What is claimed is:

1. A bias current circuit that controls an oscillator that generates an oscillation signal of a frequency corresponding to an input current, comprising:

a detection part that detects fluctuation of a control current for variably controlling the frequency of the oscillation signal; and a cancelling part generating a cancelling current for cancelling the detected fluctuation of the control current to generate the input current to the oscillator, wherein the detection part includes a conversion part that converts the control current to a voltage, and a filter part that extracts a high-frequency component of the voltage and supplies the high-frequency component of the voltage to the cancelling part, and wherein the cancelling part generates the cancelling current based on the high-frequency component of the voltage.

2. The bias current circuit according to claim 1, wherein
the conversion part includes a first MOS transistor that including a first drain, a first source and a first gate, the control current flowing between the first source and the first drain, the first drain and the first gate being short-circuited, and the voltage being output from the first drain, the cancelling part includes a second MOS transistor including a second drain, a second source and a second gate, the cancelling current flowing between the second source and the second drain, an output voltage of the filter part being input to the second gate, and a first reference voltage being input to the second source, and the input current is obtained by subtracting the cancelling current from the control current, the cancelling current flowing in a short circuit between the first source and the second drain.

3. The bias current circuit according to claim 2, wherein transconductance of the first MOS transistor is equal to transconductance of the second MOS transistor.

4. The bias current circuit according to claim 1, wherein the conversion part includes
   a third MOS transistor including a third drain, a third source and a third gate, a current proportional to the control current flowing between the third source and the third drain, and
   a fourth MOS transistor including a fourth drain, a fourth source and a fourth gate, the fourth drain being connected to the third drain, a first reference voltage being input to the fourth source, the fourth drain and the fourth gate being short-circuited, and the voltage being output from the fourth drain, and
   the cancelling part includes a fifth MOS transistor including a fifth drain, a fifth source and a fifth gate, the fifth drain being connected to the oscillator, an output voltage of the filter part being input to the fifth gate, and the first reference voltage being input to the fifth source.

5. The bias current circuit according to claim 4, wherein the transconductance of the fourth MOS transistor is equal to transconductance of the fifth MOS transistor.

6. The bias current circuit of claim 1, wherein the cancelling current has the same frequency as the high-frequency component of the voltage.

7. The bias current circuit of claim 6, wherein the cancelling current amplitude is equal to the fluctuation amplitude of the control current.

8. The bias current circuit of claim 6, wherein the output of the oscillator is proportional to a change in the control current.

9. A semiconductor integrated circuit, comprising:
   an oscillator that generates an oscillation signal of a frequency corresponding to an input current; and
   a bias current circuit that controls the oscillator, wherein the bias current circuit includes
      a detection part that detects fluctuation of a control current for variably controlling the frequency of the oscillation signal, and
      a cancelling part that uses a cancelling current for cancelling the detected fluctuation of the control current to generate the input current that is obtained by cancelling a fluctuation component of the control current,
   the detection part includes
      a conversion part that converts the control current to a voltage, and
      a filter part that extracts a high-frequency component of the voltage and supplies the high-frequency component of the voltage to the cancelling part,
   the cancelling part generates the cancelling current based on a high-frequency component of the voltage,
   the conversion part includes a first MOS transistor that includes a first drain, a first source and a first gate, the control current flowing between the first source and the first drain, the first drain and the first gate being short-circuited, and the voltage being output from the first drain,
   the cancelling part includes a second MOS transistor including a second drain, a second source and a second gate, the cancelling current flowing between the second source and the second drain, an output voltage of the filter part being input to the second gate, and a first reference voltage being input to the second source,
   the input current is obtained by subtracting the cancelling current from the control current, where the cancelling current flows in a short-circuit between the first source and the second drain, and
   the transconductance of the first MOS transistor is equal to transconductance of the second MOS transistor.

10. A bias current circuit configured to control an oscillator that generates an oscillation signal corresponding to a change in an input current to the circuit, comprising:
    a first MOS transistor configured to receive the input current at the drain thereon, wherein the drain and the gate thereof are short-circuited and further connected to a load;
    a second MOS transistor having a gate coupled to the gate of the first MOS transistor, the drain thereof configured to receive the input current;
    the drain of the second MOS transistor coupled to the input to an oscillator;
    and a compensation circuit coupled between the input current and a load, wherein the compensation circuit generates compensation current at the same frequency as, and proportional in amplitude to, the changes in the input current.

11. The bias current circuit of claim 10, wherein the compensation circuit includes a third MOS transistor connected in series with a fourth MOS transistor, wherein the gate of the third MOS transistor is connected to the gate of the first MOS transistor and gate of the fourth MOS transistor is short-circuited to the drain thereof and connected to the drain of the third MOS transistor at a node.

12. The bias current circuit of claim 11, wherein the node is directly coupled to a resistor of the filter.

13. The bias current circuit of claim 11, wherein the node is directly coupled to a capacitor of the filter.

14. The bias current circuit of claim 13, further including a fifth MOS transistor and a sixth MOS transistor connected in series between the input current and the load, the gate of the fifth transistor connected to the gate of the third transistor;
    the gate of the sixth transistor short-circuited to the drain of the sixth transistor and connected to the drain of the fifth transistor at the node.

15. The bias current circuit of claim 14, further including a seventh MOS transistor coupled to the drain of the second MOS transistor and the load and located in series with the oscillator; and
    a resistor of the filter is electrically connected between the gate of the fourth MOS transistor and the gate of the seventh MOS transistor.

16. The bias circuit of claim 15, wherein the capacitor is electrically connected between the node and the gate of the seventh MOS transistor.

17. The bias current circuit of claim 11, further including an additional MOS transistor extending intermediate of, and interconnecting, the second MOS transistor and the oscillator.

18. The bias current circuit of claim 11, further including a variable resistor extending intermediate of, and interconnecting, the second MOS transistor and the oscillator.

19. The bias current circuit of claim 11, wherein the drain of the second MOS transistor is connected to the capacitor of the filter.

* * * * *